(12) United States Patent
Yumoto et al.

(10) Patent No.: US 9,538,668 B2
(45) Date of Patent: Jan. 3, 2017

(54) WIRING SUBSTRATE, METHOD FOR MANUFACTURING WIRING SUBSTRATE, AND METHOD FOR MODIFYING SURFACE OF INSULATING LAYER

(71) Applicant: SHINKO ELECTRIC INDUSTRIES CO., LTD., Nagano (JP)

(72) Inventors: Hideki Yumoto, Nagano (JP); Yoichi Harayama, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 39 days.

(21) Appl. No.: 14/627,099

(22) Filed: Feb. 20, 2015

(65) Prior Publication Data
US 2015/0250051 A1 Sep. 3, 2015

(30) Foreign Application Priority Data

Mar. 3, 2014 (JP) .................................. 2014-040864
May 21, 2014 (JP) .................................. 2014-105652

(51) Int. Cl.
| H05K 1/03 | (2006.01) |
| H05K 1/11 | (2006.01) |
| H05K 3/34 | (2006.01) |
| H01L 23/498 | (2006.01) |
| H01L 21/48 | (2006.01) |

(52) U.S. Cl.
CPC ......... *H05K 3/3484* (2013.01); *H01L 21/4853* (2013.01); *H01L 23/49816* (2013.01); *H01L 2924/0002* (2013.01); *H05K 1/111* (2013.01); *H05K 3/3489* (2013.01); *H05K 2201/0162* (2013.01); *H05K 2203/041* (2013.01); *H05K 2203/1173* (2013.01)

(58) Field of Classification Search
CPC .... H05K 3/3484; H05K 1/0326; H05K 1/111; H05K 2201/0162; H01L 23/49816; H01L 21/4853
USPC .......................................................... 174/258
See application file for complete search history.

(56) References Cited

U.S. PATENT DOCUMENTS

| 2009/0145641 A1* | 6/2009 | Daniel | H01L 24/82 174/258 |
| 2011/0088937 A1* | 4/2011 | Ko | H05K 3/4602 174/261 |
| 2014/0092325 A1* | 4/2014 | Chen | G06F 1/1692 349/12 |
| 2014/0198427 A1* | 7/2014 | Kamobe | H01G 4/30 361/301.4 |
| 2014/0322617 A1* | 10/2014 | Wang | H01M 4/9008 429/401 |

FOREIGN PATENT DOCUMENTS

| JP | 2009-277838 | 11/2009 |
| JP | 2011096755 | * 5/2011 |
| JP | 2011-199179 | 10/2011 |

* cited by examiner

*Primary Examiner* — Timothy Thompson
*Assistant Examiner* — Charles Pizzuto
(74) *Attorney, Agent, or Firm* — IPUSA, PLLC

(57) ABSTRACT

A wiring substrate includes an insulating layer and a pad exposed from the insulating layer. An outermost surface of the insulating layer is modified to have a hydrophobic property by being stamped with silicone.

4 Claims, 12 Drawing Sheets

WIRING SUBSTRATE, METHOD FOR MANUFACTURING WIRING SUBSTRATE, AND METHOD FOR MODIFYING SURFACE OF INSULATING LAYER

CROSS-REFERENCE TO RELATED APPLICATIONS

This application is based upon and claims the benefit of priority of the prior Japanese Patent Application Nos. 2014-040864 and 2014-105652 filed on Mar. 3, 2014 and May 21, 2014, the entire contents of which are incorporated herein by reference.

FIELD

The embodiments discussed herein are related to a wiring substrate, a method for manufacturing a wiring substrate, and a method for modifying a surface of an insulating layer.

BACKGROUND

Conventionally, there is known a wiring substrate having an insulating layer that is to be its an outermost layer and a pad exposed from the insulating layer. A connection terminal for connecting to a semiconductor chip or the like is formed on the pad. For example, a solder bump is used as the connection terminal.

The solder bump is formed on a pad by, for example, applying a paste-like solder (e.g., solder cream) on the pad exposed from an insulating layer and heating and performing a reflow process on the solder to heat and melt the solder. Thereby, a substrate having a solder bump formed thereon is obtained. According to necessity, the substrate is cleaned. Thereby, the manufacturing of a wiring substrate is completed.

Patent Document 1: Japanese Laid-Open Patent Publication No. 2011-199179

However, during the process of applying the paste-like solder (e.g., solder cream) on the pad exposed from the insulating layer, a portion of the solder may adhere to an outermost surface of the insulating layer. It is to be noted that the term "outermost surface" refers to either one or both main surfaces of the wiring substrate positioned on the outermost side of the wiring substrate.

Although it is desirable for the portion of the solder adhered to the outermost surface of the insulating layer to flow on top of the pad during the reflow process, the portion of the solder may not flow on top of the pad in a case where the outermost surface of the insulating layer has good wettability (i.e., a case where the outermost surface of the insulating layer has a hydrophilic property). In this case, the portion of the solder may solidify and become residue on the outermost surface of the insulating layer.

The residual solder formed on the outermost surface of the insulating layer may detach from the outermost surface of the insulating layer during another process and cause short-circuiting with another electronic device, between pins such as connectors, or between wirings. This degrades the reliability of the wiring substrate.

Further, residue of flux contained in solder cream or the like may adhere to the outermost surface of the insulating layer. The residue of flux may create current leakage and cause insulation failure. Further, the residue of flux may be introduced to a contact of a connector or the like and cause connection failure. This degrades the reliability of the wiring substrate.

SUMMARY

According to an aspect of the invention, there is provided a wiring substrate including an insulating layer and a pad exposed from the insulating layer. An outermost surface of the insulating layer is modified to have a hydrophobic property by being stamped with silicone.

The object and advantages of the invention will be realized and attained by means of the elements and combinations particularly pointed out in the claims.

It is to be understood that both the foregoing general description and the followed detailed description are exemplary and explanatory and are not restrictive of the invention as claimed.

DESCRIPTION OF EMBODIMENTS

Figure 1:
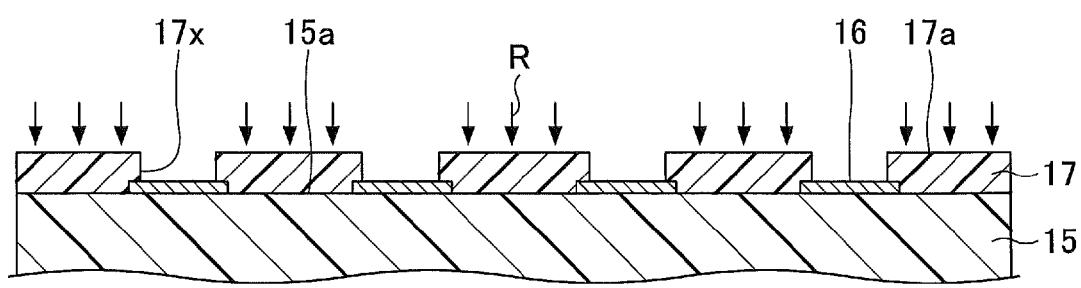
FIG. 1 is a cross-sectional view illustrating a part of a wiring substrate according to a first embodiment of the present invention.

In the following, embodiments of the present invention are described with reference to the accompanying drawings.

Throughout the drawings, like reference numerals are used to denote like parts and components and further explanation thereof may be omitted.

<First Embodiment>
[Structure of a Wiring Substrate of the First Embodiment]

First, a structure of a wiring substrate 1 according to the first embodiment of the present invention is described. FIG. 1 is a schematic diagram illustrating the wiring substrate 1 of the first embodiment. FIG. 1 illustrates only the vicinity of an outermost layer on one side of the wiring substrate 1. With reference to FIG. 1, the wiring substrate 1 includes, for example, an insulating layer 15, a pad 16, and a solder resist layer 17. A given under-layer such as another insulating layer, a wiring layer, or a core layer may be formed under the insulating layer 15. The under-layer of the insulating layer 15 may include, for example, a layer having resin as a main component, a layer having silicon as a main component, or a layer having a ceramic as a main component.

For the sake of convenience, in this embodiment, the side positioned toward the solder resist layer 17 of the wiring substrate 1 may be described as "upper side" or "one side" whereas the side positioned toward the insulating layer 15 of the wiring substrate 1 may be described as "lower side" or "other side". Further, a surface of each part (element) positioned toward the side of the solder resist layer 17 may be described as "upper surface" or "one surface" whereas a surface of each part (element) positioned toward the insulating layer 15 may be described as "lower surface" or "other surface". However, the wiring substrate 1 may be used in an upside down state or positioned at a given angle. Further, a "plan view" refers to observing an object from a direction of a line normal to an upper surface 15a of the insulating layer 15. Further, a "plan-view shape" of an object refers to a shape of the object observed from a direction of a line normal to the upper surface 15a of the insulating layer 15.

The insulating layer 15 may be formed of, for example, an insulating resin having an epoxy type resin as a main component. The insulating layer 15 may include a filler such as silica ($SiO_2$). The thickness of the insulating layer 15 may be, for example, approximately 15 μm to 35 μm.

The pad 16 is formed on the upper surface 15a of the insulating layer 15. The material of the pad 16 may be, for example, copper (Cu). The thickness of the pad 16 may be, for example, approximately 10 μm to 30 μm.

The solder resist layer 17 is an insulating layer that is to become the outermost layer of the wiring substrate 1 on the one side of the wiring substrate 1. The solder resist layer 17 is formed on the upper surface 15a of the insulating layer 15 to cover the pad 16. The material of the solder resist layer 17 is not limited in particular. For example, an insulating material such as a thermally-setting or optically setting photosensitive compound resin may be used as the material of the solder resist layer 17. For example, an epoxy type resin or an acrylic type resin may be used as the thermally-setting or optically setting photosensitive compound resin. The thickness of the solder resist layer 17 may be, for example, approximately 15 μm to 35 μm.

The solder resist layer 17 includes an opening 17x. A part of an upper surface of the pad 16 is exposed at a bottom part of the opening 17x. The pad 16 exposed at the bottom part of the opening 17x is to become an external connection terminal, so that the pad 16 can be connected to, for example, a semiconductor chip or another wiring substrate by way of a conductive material such as solder or a conductive paste.

The plan-view shape of the opening 17x may be, for example, a circular shape. In this case, the opening 17x may be designed to have a diameter according to a connection target (e.g., semiconductor chip, wiring substrate) to be connected to the pad 16. In the first embodiment, the solder resist layer 17 is formed to overhang (project) above an outer peripheral part of the upper surface of the pad 16. That is, an end part of the solder resist layer 17 on the side of the opening 17x may be formed to annularly cover the outer peripheral part of the upper surface of the pad 16.

The upper surface 17a (outermost surface) of the solder resist layer 17 is modified to have a hydrophobic property. The arrow R of FIG. 1 schematically indicates that the upper surface 17a of the solder resist layer 17 has a hydrophobic property. An inner wall surface of the opening 17x of the solder resist layer 17 may also be modified to have a hydrophobic property. Accordingly, the solder resist layer 17 having its surface (upper surface 17a or both the upper surface 17a and the inner surface of the opening 17x) modified to have a hydrophobic property (adjusted wettability) is included in the wiring substrate 1. Because the solder resist layer 17 is formed according to a concave-convex structure of the layer under the solder resist layer (e.g., pad 16), the upper surface 17a of the solder resist layer 17 does not necessarily need to be flat.

<Method for Modifying an Upper Surface of an Insulating Layer to have a Hydrophobic Property>

Next, a method for modifying an upper surface of an insulating layer to have a hydrophobic property is described. The following example illustrates a method for modifying a surface of the solder resist layer 17 of the wiring substrate 1 illustrated in FIG. 1 to have a hydrophobic property. The surface of the solder resist layer 17 is modified to have a hydrophobic property by stamping the surface of the solder resist layer 17 with silicone. This method is described with reference to FIGS. 2A-3B.

Figure 2A:
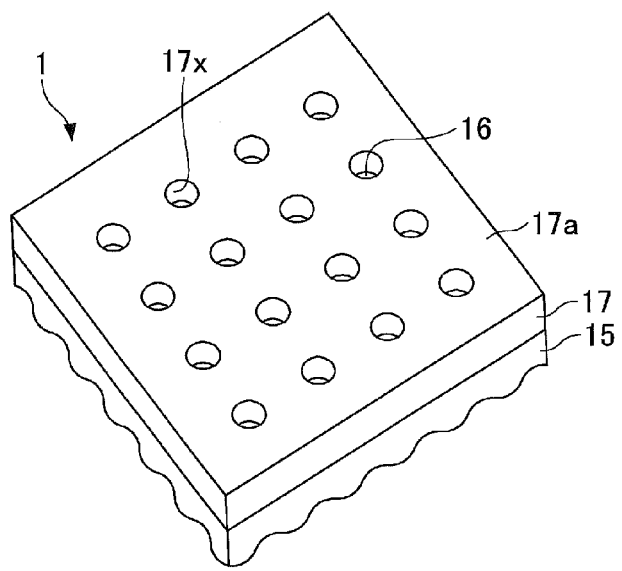
FIGS. 2A and 2B are schematic diagrams for describing a method for modifying the hydrophobicity of a surface of an insulating layer (part 1)

As illustrated in FIG. 2A, the wiring substrate 1 is manufactured by using a commonly known method. At this point, the surface of the solder resist layer 17 is not yet modified to a hydrophobic property. For example, the surface of the solder resist layer 17 may have a hydrophilic property.

Figure 2B:
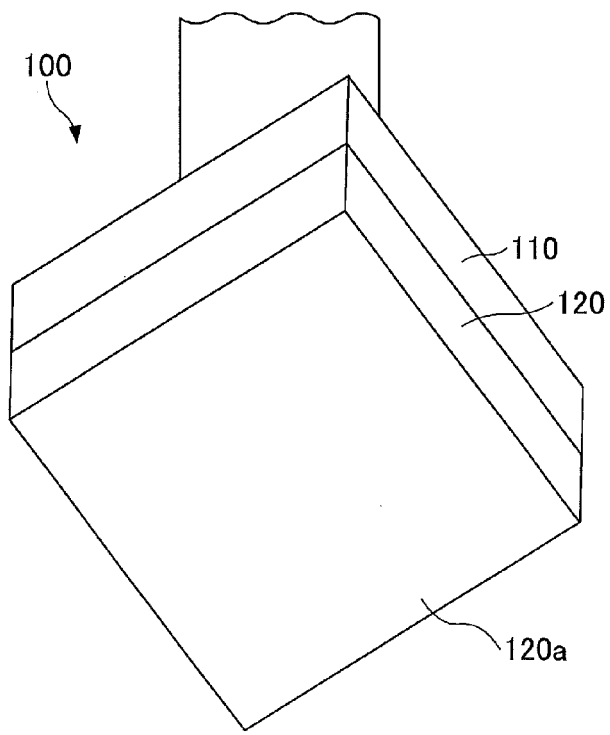

As illustrated in FIG. 2B, a silicone stamp 100 is prepared. The silicone stamp 100 has a sheet-like silicone 120 attached to a lower surface of a stamping jig 110. A stamping surface 120a of the silicone stamp 100 is preferred to have substantially the same shape as the upper surface 17a of the solder resist layer 17. Alternatively, the stamping surface 120a of the silicone stamp 100 may have a shape that is one size larger than the upper surface 17a of the solder resist layer 17. Because the upper surface 17a of the solder resist layer 17 of this embodiment is a rectangular shape, the stamp surface 120a may be formed having a rectangular shape that is substantially the same size as the upper surface 17a of the solder resist layer 17 or one size larger than the upper surface 17a of the solder resist layer 17.

It is, however, to be noted that the shape or structure of the silicone 120 to be stamped is not to be limited in particular. That is, the silicone 120 may have a given shape or structure as long as a predetermined area of the surface of the solder resist layer 17 can be stamped. For example, a plate-like shape or a rod-like shape may be selected as the shape or structure of the silicone 120 according to the method or apparatus used for stamping with the silicone 120.

Further, the shape of the stamp surface 120a of the silicone 120 is not limited in particular. That is, the stamp surface 120a of the silicone 120 may have a given shape as long as a predetermined area of the surface of the solder resist layer 17 can be stamped. For example, the shape of the stamp surface 120a of the silicone 120 may be a flat-shape, a curved-shape, or a combination of the flat-shape and curved-shape. Alternatively, in a case where only the vicinity of the opening 17x is desired to be modified, a protrusion having a dotted shape (polka-dot pattern), a striped shape (stripe pattern), or a meshed shape (netted pattern) may be formed on the stamp surface 120a.

Further, the method for stamping with the silicone 120 is not limited in particular. For example, the silicone stamp 100 that is used may include a single stamp surface 120a as described above. Alternatively, a silicone stamp that has a stamp surface(s) having a smaller area than the upper surface 17a of the solder resist layer 17 may be prepared, so that the stamp surface can be sequentially pressed to different areas of the upper surface 17a. In the case of stamping different areas of the upper surface 17a, silicon stamps having stamp surfaces of different kinds of shapes may be prepared.

Figure 3A:
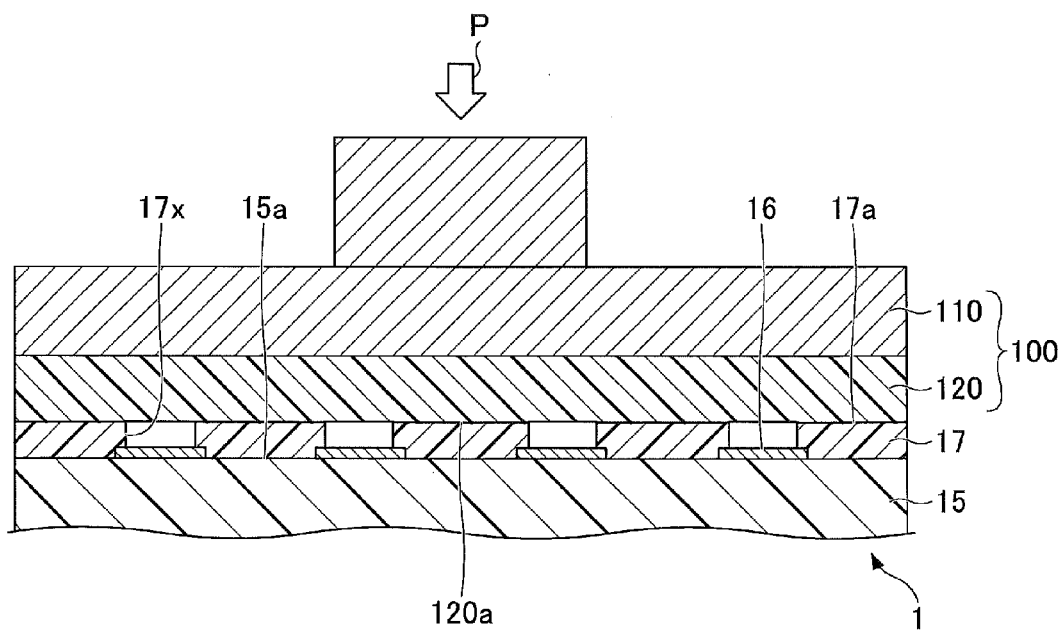
FIGS. 3A and 3B are schematic diagrams for describing a method for modifying the hydrophobicity of a surface of an insulating layer (part 2)

Then, as illustrated in FIG. 3A, the stamp surface 120a of the silicone stamp 100 and the upper surface 17a of the solder resist layer 17 are positioned facing each other. Then, the silicone stamp 100 is moved in an arrow P direction, so that the stamp surface 120a and the upper surface 17a are mutually contacted with a predetermined pressure (force) for a predetermined time (compression bonding). Then, according to necessity, the silicone 120 and the solder resist layer 17 may be heated for a predetermined time. By heating the silicone 120 and the solder resist layer 17 for a predetermined time, the below-described covalent bonding between the silicone 120 and the solder resist layer 17 can be increased.

In this case, the time or temperature for heating the silicone 120 and the solder resist layer 17 may be optimized according to, for example, the kind of the silicone 120 and the solder resist layer 17, the shape of the area to be modified, or the desired degree of modification. For example, although the temperature for the heating may range from approximately normal temperature to 270° C., approximately 260° C. is preferable. Further, although the time for the heating may range from approximately 0 to 5 minutes, approximately 3 minutes is preferable.

Figure 3B:
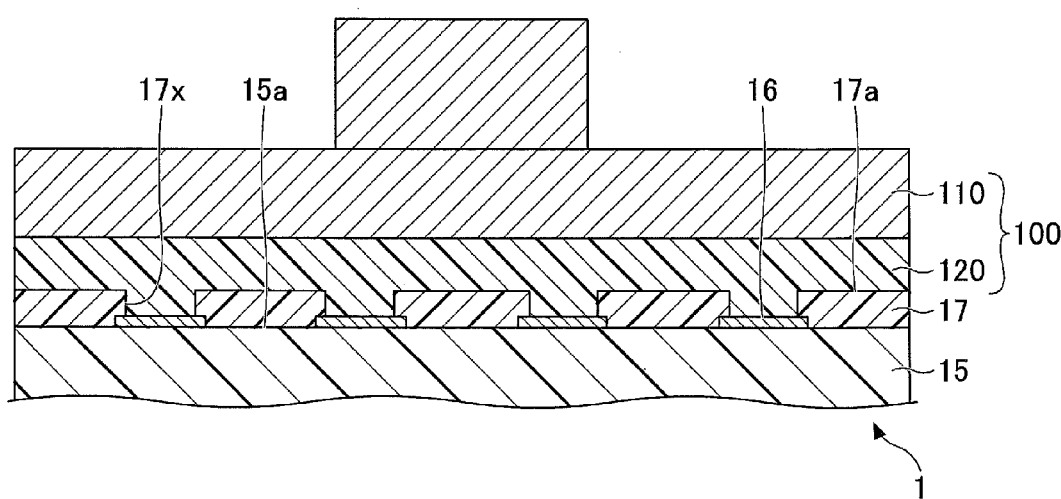

Because silicone is a material having plasticity (softness or elasticity), the silicone 120 can be deformed in accordance with the concave-convex shape of the solder resist layer 17 and the pad 16 (as illustrated in FIG. 3B) by the above-described optimizing of pressure or the like. Thereby, even in a case where a surface of an insulating layer is not flat, a desired area of the surface of the insulating layer can be modified to have a hydrophobic property.

After a predetermined time has elapsed from the state illustrated in FIGS. 3A and 3B, the silicone stamp 100 is removed. Thereby, an area of the surface (upper surface 17a, or the upper surface 17a and the inner wall surface of the opening 17x) of the solder resist layer 17 that has been contacting the stamp surface 120a of the silicone stamp 100 is modified to have a hydrophobic property. For example, in the case illustrated in FIG. 3A, only the upper surface 17a of the solder resist layer 17 is modified to a hydrophobic property. In the case illustrated in FIG. 3B, the upper surface 17a of the solder resist layer 17 and the inner wall surface of the opening 17x are modified to a hydrophobic property.

The range in which pressure is exerted from the silicone stamp 100 in FIGS. 3A and 3B can be optimized according to, for example, the kind of the silicone 120, the kind of the solder resist layer 17, the shape of the area to be modified, and the desired degree of modification. The pressure exerted from the silicone stamp 100 can be discretionally selected according to, for example, the thickness of the silicone 120 to be used. The pressure exerted from the silicone stamp 100 is preferred to range approximately from 30 to 120 kg/cm$^2$.

Accordingly, the area of the surface of the solder resist layer 17 modified to a hydrophobic property is an area that is stamped by the stamp surface 120a of the silicone stamp 100. It is, however, to be noted that the area of the surface of the solder resist layer 17 modified to a hydrophobic property is not provided as a structure having a substantial amount of thickness but as a part of the solder resist layer 17 whose surface is modified. The modification of the surface of the solder resist layer 17 can be described with the following explanation. However, modification of the surface of the solder resist layer 17 is not limited to the following explanation.

In the modification of the surface of the solder resist layer 17, a physical action, a chemical action, or both occur between a component contained in silicone 120 and a component of the surface of the solder resist layer 17. By such action, the type and the number of the hydrophilic groups or the hydrophobic groups of the surface of the solder resist layer 17 (including the vicinity of the surface of the solder resist layer 17) are changed.

The component contained in the silicone 120 may be, for example, a low-molecular or a medium-molecular weight oligomer (siloxane oligomer). A covalent bond is formed by a reaction between the oligomer contained in the silicone 120 and a hydroxyl group or a carboxyl group on the surface of the solder resist layer 17. Thereby, the hydroxyl group or the carboxyl group that is a group having strong hydrophilicity can be changed to a group having strong hydrophobicity. Further, the covalent bond can be further perfected and its bonding may be further enhanced by performing a heating process at an appropriate temperature for an appropriate time. It is, however, to be noted that a structure having a substantial thickness is not provided on the area in which the covalent bond is formed.

Further, the modified area of the surface of the solder resist layer 17 can be prevented from being removed by a typical solvent cleaning process owing to the above-described strong covalent bonding property. For example, after an area of the surface of the solder resist layer 17 is modified to have a hydrophobic property, the modified area can be prevented from being removed even where the surface of the solder resist layer 17 is cleaned with a solvent (e.g., alcohol) for performing various processes. The surface of the solder resist layer 17 can be modified to have a hydrophobic property by the above-described method not only in a case where the surface of the solder resist layer 17 is flat but also in a case where the surface of the solder resist layer 17 has a shape corresponding to the convex-concave structure of the layer under the solder resist layer 17. This can be achieved because the silicone 120 stamps (is pressed against) the solder resist layer 17 is a material having plasticity (softness or elasticity).

Accordingly, the area of the solder resist layer 17 that is modified to have a hydrophobic property is formed without a structure having a substantial thickness. Further, by performing component analysis on the surface of the solder resist layer 17, the existence of elements such as silicon, oxygen, and carbon can be measured. Further, the area of the solder resist layer 17 that is modified to have a hydrophobic property can be prevented from being removed when being cleaned with a solvent. These aspects of the solder resist layer 17 can be confirmed by performing wetting angle measurement, surface or cross-section observation using a microscope, and surface or cross-section element analysis (e.g., EDX (Energy Dispersive X-ray spectroscopy).

The silicone that can be used for the surface modification method of this embodiment is not limited in particular as long as the silicone is generally used in the field of the art. For example, the silicone may include a polymer such as a polydialkylsiloxane (polymerized dialkylsiloxane), particularly, dimethylpolysiloxane. Further, the generally used silicone is known to include various amounts of low-molecular siloxyane such as straight-chain or cyclic monomers and oligomers. The silicone is commercially available. Thus, the silicones can be commercially obtained and used as the surface modification method of this embodiment.

<Effect in a Case where a Surface of an Insulating Layer is Modified to have a Hydrophobic Property>

Next, an effect in a case where a surface of an insulating layer is modified to have a hydrophobic property is described. In the following example, the upper surface 17a of the solder resist layer 17 of the wiring substrate 1 illustrated in FIG. 1 is modified to have a hydrophobic property, and then the solder bump 25 is formed on the pad 16 exposed in the opening 17x.

Figure 4A:
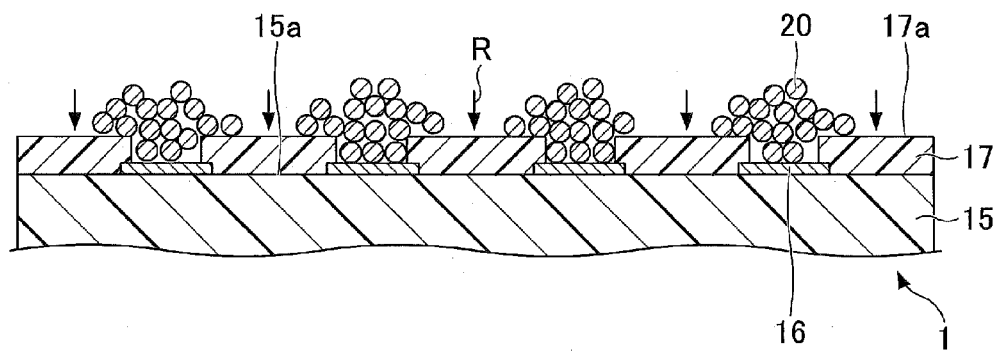
FIGS. 4A and 4B are schematic diagrams for describing an effect of modifying the hydrophobicity of a surface of an insulating layer.

First, a paste-like solder 20 (e.g., solder cream) is applied on the pad 16 exposed in the opening 17x as illustrated in FIG. 4A. In applying the solder 20, the solder 20 is also applied on a part of the surface 17a of the solder resist layer 17 in the vicinity of the opening 17x due to the difficulty of applying the solder 20 only to the pad 16x exposed in the opening 17x.

Figure 4B:
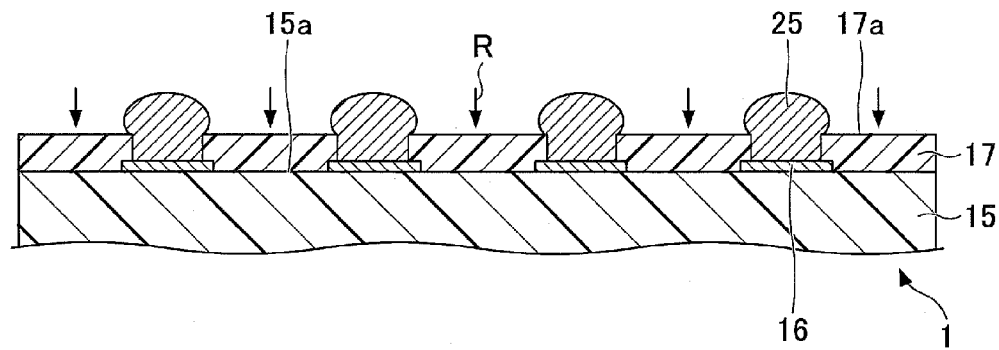

Then, the wiring substrate 1 with the solder 20 applied is placed in a reflow oven and heated at a predetermined temperature (e.g., approximately 200° C. to 250° C.) to melt the solder 20. Then, the solder 20 is hardened by lowering the temperature. Thereby, the solder bump 25 is formed as illustrated in FIG. 4B.

The upper surface 17a of the solder resist layer 17 is modified to have a hydrophobic property. That is, the upper surface 17a of the solder resist layer 17 is modified to have poor solder wettability. Thereby, the melted solder 20 is repelled from the upper surface 17a of the solder resist layer 17, gathered into the opening 17x, and solidified. That is, by modifying the upper surface 17a of the solder resist layer 17 to have a hydrophobic property, it becomes difficult for the melted solder 20 to adhere to the upper surface 17a. Accordingly, the solidified solder 20 (residue) can be prevented from remaining on the upper surface 17a.

Figure 5:
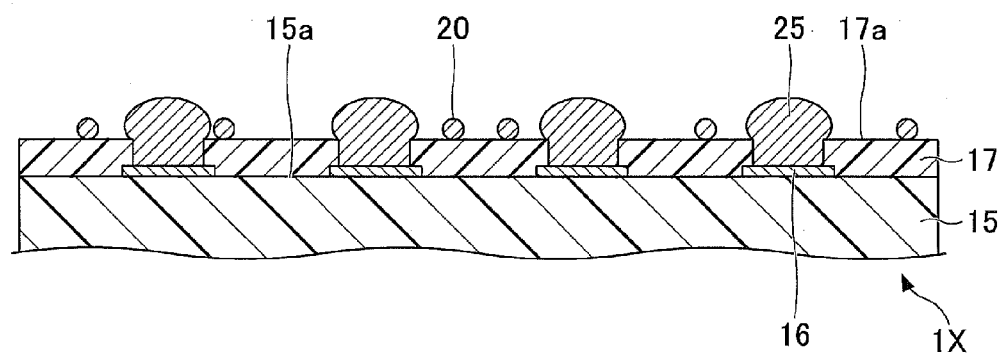
FIG. 5 is a cross-sectional view illustrating a part of a wiring substrate of a comparative example.

FIG. 5 is a cross-sectional view illustrating a wiring substrate 1X of a comparative example. In the wiring substrate 1X of FIG. 5, the upper surface 17a of the solder resist layer 17 is not modified to have a hydrophobic property unlike that of the wiring substrate 1 of the first embodiment. That is, the upper surface 17a of the solder resist layer 17 of the wiring substrate 1X has a better solder wettability compared to that of the wiring substrate 1.

Therefore, although a large portion of the solder 20 melted on the upper surface 17a of the solder resist layer 17 gathers into the opening 17x, some of the solder 20 is not repelled from the upper surface 17a and remains adhered to the upper surface 17a. Then, the solder 20 solidified on the upper surface 17a of the solder resist layer 17 becomes residue adhered to the upper surface 17a. The solidified solder 20 (residue) remaining on the upper surface 17a of the solder resist layer 17 may be detached from the upper surface 17a during another process and cause short-circuiting with another electronic device, between pins such as connectors, or between wirings.

On the other hand, with the wiring substrate 1 of the first embodiment, solidified solder 20 can be prevented from remaining on the upper surface 17a of the solder resist layer 17 by modifying the upper surface 17a to have a hydrophobic property. As a result, short-circuiting with another electronic device, between pins such as connectors, or between wirings due to solidified solder 20 remaining on the upper surface 17a of the solder resist layer 17 can be prevented. That is, the reliability of the wiring substrate 1 can be improved.

The same effect can also be attained in a case where a conductive paste such as a silver paste is used instead of the solder 20. Further, in a case where flux is contained in the paste-like solder 20, the flux can also be prevented from remaining on the upper surface 17a modified to have a hydrophobic property. Even if such flux remains on the upper surface 17a, such flux can be easily removed in a subsequent flux-cleaning process.

On the other hand, in a case where the upper surface 17a is not modified to have a hydrophobic property, such flux may firmly adhere to the upper surface 17a. Thus, it may be difficult to completely remove the residue of such flux in a subsequent flux-cleaning process. As a result, the residue of such flux may create current leakage and cause insulation failure. Further, the residue of such flux may be introduced to a contact of a connector or the like and cause connection failure. This degrades the reliability of the wiring substrate.

With the wiring substrate 1 of the first embodiment, residue of flux can be prevented owing to the upper surface 17a of the solder resist layer 17 being modified to have a hydrophobic property. Thereby, the reliability of the wiring substrate 1 can be improved.

<First Modified Example of the First Embodiment>

The first modified example of the first embodiment illustrates a wiring substrate 1A including a solder resist layer 17 having an opening 17y that exposes an entire pad 16. In the first modified example of the first embodiment, like components are denoted with like reference numerals as those of the first embodiment and are not further explained.

Figure 6:
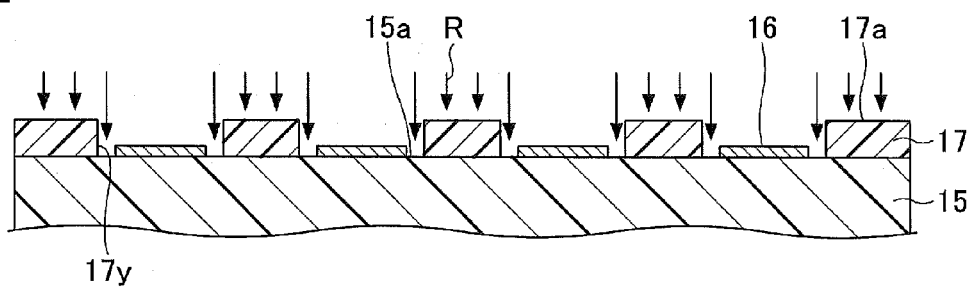
FIG. 6 is a cross-sectional view illustrating a wiring substrate according to a first modified example of the first embodiment.

FIG. 6 is a cross-sectional view illustrating a part of the wiring substrate 1A according to the first example of the first embodiment. FIG. 6 illustrates only the vicinity of an outermost layer on one side of the wiring substrate 1A. In the first embodiment, the solder resist layer 17 is formed to overhang (project) above an outer peripheral part of the upper surface of the pad 16. That is, an end part of the solder resist layer 17 on the side of the opening 17x may be formed to annularly cover the outer peripheral part of the upper surface of the pad 16. On the other hand, in the wiring substrate 1A illustrated in FIG. 6, the entire surface of the pad 16 and an upper surface 15a of the insulating layer 15 surrounding the pad 16 are exposed in the opening 17y of the solder resist layer 17.

By stamping the wiring substrate 1A with the silicone stamp 100 as illustrated in FIG. 3B, the upper surface 17a (outermost surface) of the solder resist layer 17, the inner wall surface of the opening 17y, and the upper surface 15a of the insulating layer 15 exposed in the opening 17y are modified to have a hydrophobic property. Thereby, similar to the first embodiment, solidified solder 20 (residue) can be prevented from remaining on the upper surface 17a of the solder resist layer 17, the inner wall surface of the opening 17y, and the upper surface 15a of the insulating layer 15 exposed in the opening 17y. As a result, similar to the first embodiment, short-circuiting with another electronic device, between pins such as connectors, or between wirings due to solidified solder 20 remaining on the upper surface 17a of the solder resist layer 17 can be prevented. Further, in a case where flux is contained in the solder 20, the flux can also be prevented from remaining on the upper surface 17a of the solder resist layer 17.

<Second Modified Example of the First Embodiment>

The second modified example of the first embodiment illustrates a wiring substrate 1B formed without the solder resist layer 17. In the second modified example of the first embodiment, like components are denoted with like reference numerals as those of the first embodiment and are not further explained.

Figure 7:
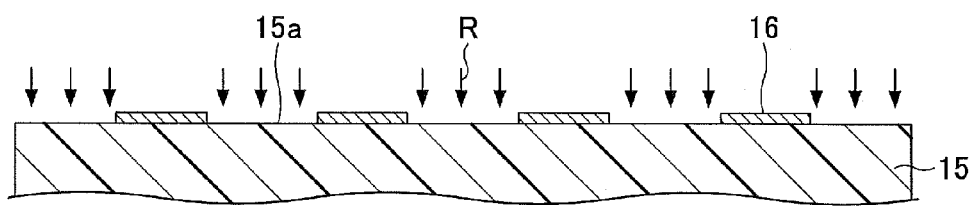
FIG. 7 is a cross-sectional view illustrating a wiring substrate according to a second modified example of the first embodiment.

FIG. 7 is a cross-sectional view illustrating a part of the wiring substrate 1B according to the second example of the first embodiment. FIG. 7 illustrates only the vicinity of an outermost layer on one side of the wiring substrate 1B. In the wiring substrate 1 (see FIG. 1) of the first embodiment, the solder resist layer 17 is formed on upper surface 15a of the insulating layer 15 to selectively expose the pad 16. On the other hand, although the wiring substrate 1B (see FIG. 7) of the second modified example of the first embodiment includes the pad 16 formed on the upper surface 15a (outermost surface) of the insulating layer 15, the wiring substrate 1B is formed without the solder resist layer 17.

By stamping the wiring substrate 1B with the silicone stamp 100 as illustrated in FIG. 3A, the upper surface 15a of the insulating layer 15 is modified to have a hydrophobic property. Thereby, similar to the first embodiment, solidified solder 20 (residue) can be prevented from remaining on the upper surface 15a of the insulating layer 15. As a result, similar to the first embodiment, short-circuiting with another electronic device, between pins such as connectors, or between wirings due to solidified solder 20 remaining on the upper surface 15a of the insulating layer 15 can be prevented. Further, in a case where flux is contained in the solder 20, the flux can also be prevented from remaining on the upper surface 15a of the insulating layer 15.

<Third Modified Example of the First Embodiment>

The third modified example of the first embodiment illustrates another wiring substrate 1C formed without the solder resist layer 17. In the third modified example of the first embodiment, like components are denoted with like reference numerals as those of the first embodiment and are not further explained.

Figure 8:
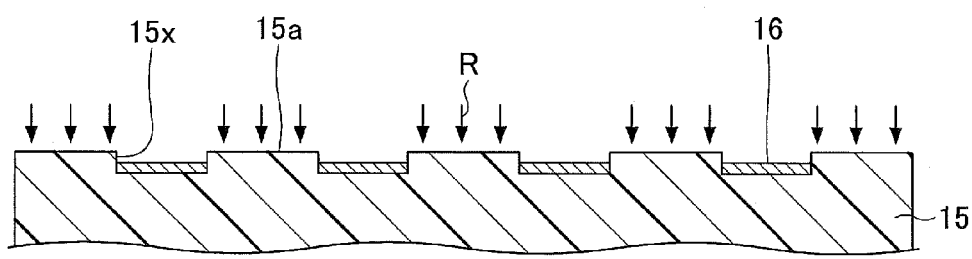
FIG. 8 is a cross-sectional view illustrating a wiring substrate according to a third modified example of the first embodiment.

FIG. 8 is a cross-sectional view illustrating a part of the wiring substrate 1C according to the third example of the first embodiment. FIG. 8 illustrates only the vicinity of an outermost layer on one side of the wiring substrate 1C. In the wiring substrate 1C (see FIG. 8) of the third modified example, the solder resist layer 17 is not formed on the upper surface 15a (outermost surface) of the insulating layer 15. Further, in the wiring substrate 1C, a recess part 15x is formed in the upper surface 15a of the insulating layer 15 in which the upper surface of the pad 16 is a bottom surface of the recess part 15x. That is, the upper surface of the pad 16 is exposed from a part of the insulating layer 15 that is recessed relative to the upper surface 15a of the insulating layer 15. However, in the wiring substrate 1C, the upper surface of the pad 16 may be flush with the upper surface 15a of the insulating layer 15 (in this case, the wiring substrate 1C is formed without the recess part 15x).

By stamping the wiring substrate 1C with the silicone stamp 100 as illustrated in FIG. 3A or FIG. 3B, the upper surface 15a of the insulating layer 15 can be modified to have a hydrophobic property. Thereby, similar to the first embodiment, solidified solder 20 (residue) can be prevented from remaining on the upper surface 15a of the insulating layer 15. As a result, similar to the first embodiment, short-circuiting with another electronic device, between pins such as connectors, or between wirings due to solidified solder 20 remaining on the upper surface 15a of the insulating layer 15 can be prevented. Further, in a case where flux is contained in the solder 20, the flux can also be prevented from remaining on the upper surface 15a of the insulating layer 15.

As illustrated with the second and third modified examples of the first embodiment, the silicone stamp 100 may not only be applied to a so-called solder resist layer but also to, for example, an insulating layer included in a build-up substrate, so that the insulating layer can be modified to have a hydrophobic property. It is to be noted that, in the present application, the so-called solder resist layer (e.g., solder resist layer 17) and the insulating layer included in a build-up substrate (e.g., insulating layer 15) may both be collectively referred to as "insulating layer".

<First Working Example>

First, six substrates were prepared, each having dimensions of 40 mm in horizontal length, 40 mm in vertical length, and 1 mm in thickness. An epoxy type resin was applied to an entire surface on one side of each of the substrates. The epoxy type resin was applied by using a roll coating method. After the substrates had been dried at room temperature for approximately 12 hours, the substrates were placed in a heating oven of approximately 150° C. to be solidified. Thereby, solder resist layer A having a thickness of approximately 20 μm was formed on each of the substrates.

Then, the silicone 120 that is processed from a silicone sheet (vertical length: 60 mm, horizontal length: 120 mm, thickness: 1 mm, manufactured by Wacom Corp.) was attached to the stamping jig 110 (vertical length: 40 mm, horizontal length: 40 mm, thickness: 30 mm), to thereby form the silicone stamp 100 as illustrated in FIG. 2B.

Then, with respect to three substrates among the six substrates, silicone stamping was performed on the upper surface of the solder resist layer A. More specifically, similar to the process illustrated with FIG. 3A, the silicone stamp 100 was pressed to the upper surface of the solder resist layer A with a force of 100 kg for 3 seconds. Then, the substrates were heated at 150° C. for a predetermined time. As comparative examples, the silicone stamping process was not performed on the upper surface of the solder resist layer A of the other three substrates.

Then, a dynamic contact angle (DCA) of each of the substrates was measured by applying pure water to the upper surface of the solder resist layer A. The dynamic contact angle was measured by using a full-automatic contact meter manufactured by Kyowa Interface Science Co., Ltd. Further, surface energy (SE) of each of the substrates was measured based on a Kaelble-Uy method by applying pure water and diodomethane to the upper surface of the solder resist layer A. The surface energy was also measured by using a full-automatic contact meter manufactured by Kyowa Interface Science Co. Ltd. The measurement results are illustrated in FIGS. 9 and 10.

Figure 9:
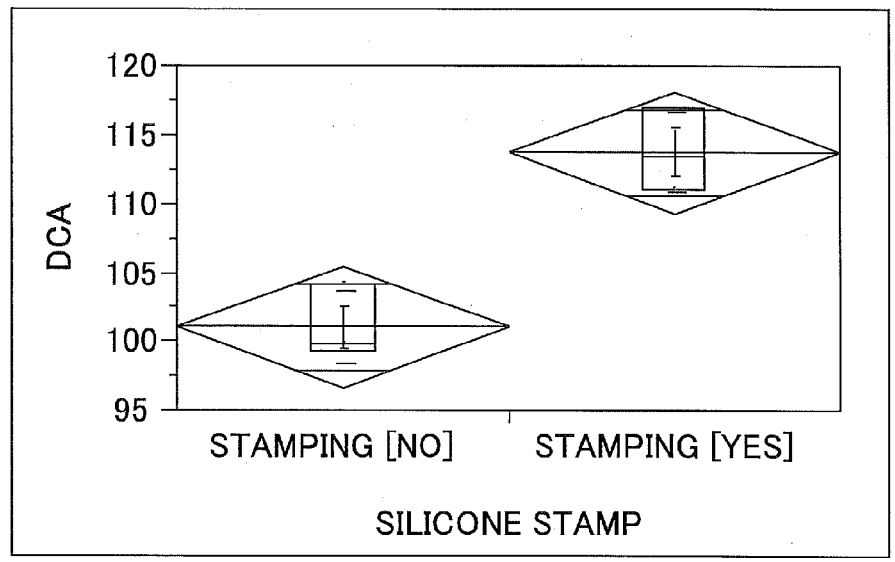
FIG. 9 is a graph illustrating a measurement result of a DCA (Dynamic Contact Angle) of a first practical example.

As illustrated in FIG. 9, the dynamic contact angle (DCA) was 101 (±2) in a case where the silicone stamping was not performed ("Stamping [No]" in FIG. 9). On the other hand, the dynamic contact angle (DCA) was 114 (±2) in a case where the silicone stamping was performed ("Stamping [Yes]" in FIG. 9). This shows a significant difference between performing the silicone stamping and not performing the silicone stamping.

Figure 10:
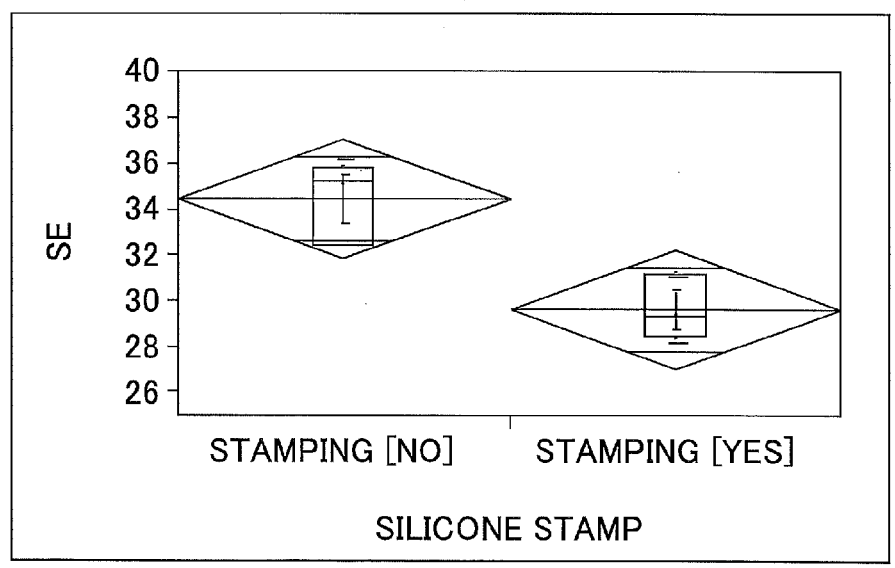
FIG. 10 is a graph illustrating a measurement result of SE (Surface Energy) of the first practical example.

Further, as illustrated in FIG. 10, the surface energy (SE) was 34 (±1) in a case where the silicone stamping was not performed ("Stamping [No]" in FIG. 10). On the other hand, the surface energy (SE) was 30 (±1) in a case where the silicone stamping was performed ("Stamping [Yes]" in FIG. 10). This shows a significant difference between performing the silicone stamping and not performing the silicone stamping. That is, it was confirmed that the surface of the insulating layer can be modified to have a hydrophobic property (reduced wettability) by performing the silicone stamping.

<Second Working Example>

Similar to the first working examples, two substrates were prepared to confirm the modification effect of a resin material other than that of the solder resist layer. Then, an insulating layer B is formed entirely on one side of each of the substrates. Further, a pad is formed on an upper surface of the insulating layer B (without forming a solder resist layer). Thereby, a wiring substrate similar to the one illustrated in FIG. 7 was fabricated. An epoxy type resin was used as the material of the insulating layer B. Copper (Cu) was used as the material of the pad.

Then, with respect to one substrate of the two substrates, silicone stamping was performed on the upper surface of the insulating layer B. More specifically, similar to the process illustrated in FIG. 3A, the silicone stamp 100 was pressed to the upper surface of the insulating layer B with a force of 50 kg for 3 seconds. Then, the substrate was heated at 150° C. for a predetermined time. As a comparative example, silicone stamping was not performed on the upper surface of the insulating layer B of the other one of the two substrates.

Then, a paste-like solder was applied on the pad of each of the substrates. Then, the substrates with solder applied were placed in a reflow oven. Thereby, a solder bump D was formed. Then, a microscope photograph of the upper surface of the insulating layer B of each substrate was taken by using a microscope. The result of each substrate is illustrated in FIGS. 11A and 11B.

In the case where silicone stamping is performed, the solder that is melted on the upper surface of the insulating layer B is repelled from the upper surface of the insulating layer B to be gathered onto the pad and solidify. Thereby, the solder bump D is formed as illustrated in FIG. 11A. Therefore, solidified solder (residue) does not remain on the upper surface of the insulating layer B. On the other hand, in the case where silicone stamping is not performed, a large portion of solder that is melted on the upper surface of the insulating layer B gathers on the pad and solidifies to become the solder bump D. However, a portion of the solder is not repelled from the upper surface of the insulating layer B and solidifies in a state adhered to the upper surface of the insulating layer B. Thereby, residue E of the solder is formed on the upper surface of the insulating layer B.

Figure 11A:
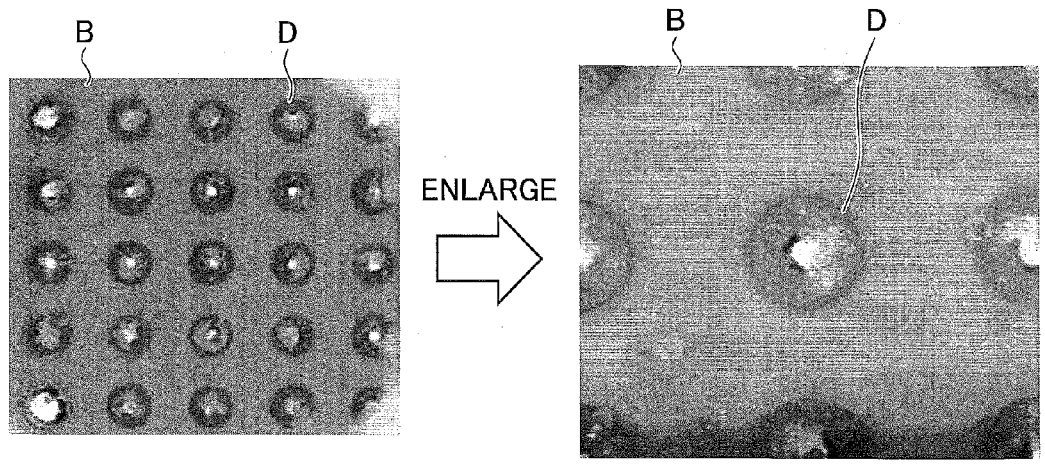
FIGS. 11A and 11B are microscope photographs obtained from a second practical example.
Figure 11B:
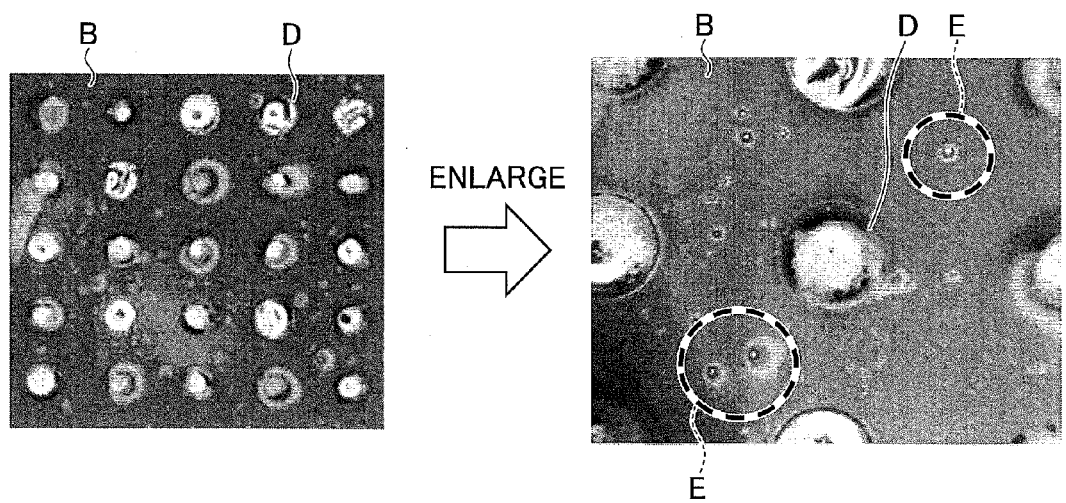

According to the results illustrated in FIGS. 11A and 11B, it was confirmed that a surface of an insulating layer can be modified to have a hydrophobic property (reduced wettability) and the forming of solder residue can be prevented by performing silicone stamping.

<Second Embodiment>

The second embodiment of the present invention illustrates a solder bump being formed on a wiring substrate with a method that is different from the first embodiment. In the second embodiment, like components are denoted with like reference numerals as those of the first embodiment and are not further explained.

Figure 12A:
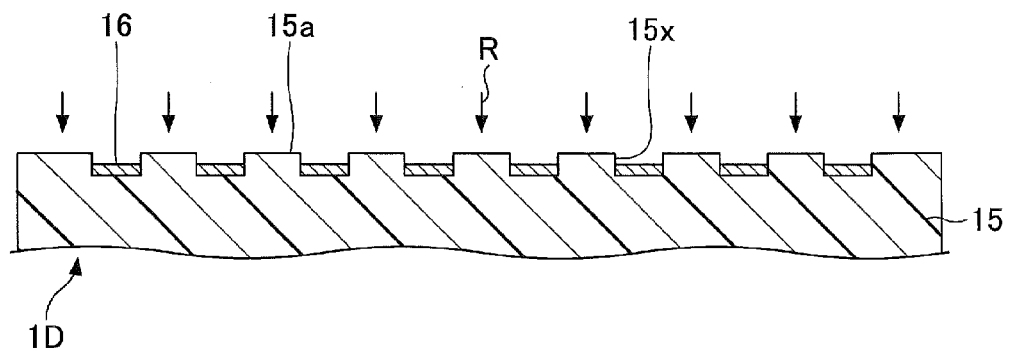
FIGS. 12A-12C are schematic diagrams illustrating processes for forming solder bumps on a wiring substrate according to a second embodiment of the present invention (part 1)

FIGS. 12A-13C illustrate processes for forming a solder bump on a wiring substrate according to the second embodiment of the present invention. First, a wiring substrate 1D is prepared. Then, the silicone stamp 100 is stamped on the wiring substrate 1D as illustrated in FIG. 3A or 3B. Thereby, the upper surface 15a of the insulating layer 15 of the wiring substrate 1D can be modified to have a hydrophobic property as illustrated in FIG. 12A. The arrow R of FIG. 12A schematically indicates that the upper surface 17a of the solder resist layer 17 has a hydrophobic property.

Although the configuration of the wiring substrate 1D is substantially the same as the wiring substrate 10 (see FIG. 8), the diameter of the pad 16 is less and the pitch between the pads 16 is narrower compared to the wiring substrate 10. The diameter of the pad may be, for example, approximately 50 μm to 100 μm. The pitch between the pads 16 may be, for example, approximately 100 μm to 150 μm. The pads 16 may be arranged to form, for example, an area-array.

Figure 12B:
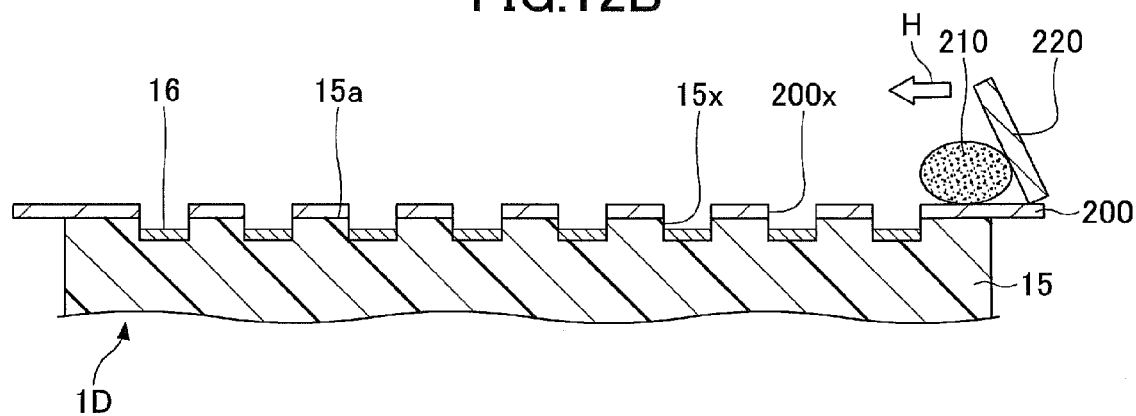

Then, as illustrated in FIG. 12B, a mask for flux printing (flux printing mask) 200 is placed on the upper surface 15a of the insulating layer 15. The flux printing mask 200 includes openings 200x for exposing the pads 16 from the recess parts 15x. Then, flux 210 is applied to the flux printing mask 200 and a squeegee 220 is moved above the flux printing mask 200 in direction H (substantially horizontal direction), so that the flux 210 covers the upper surface of each pad 16 in the recess part 15x.

Figure 12C:
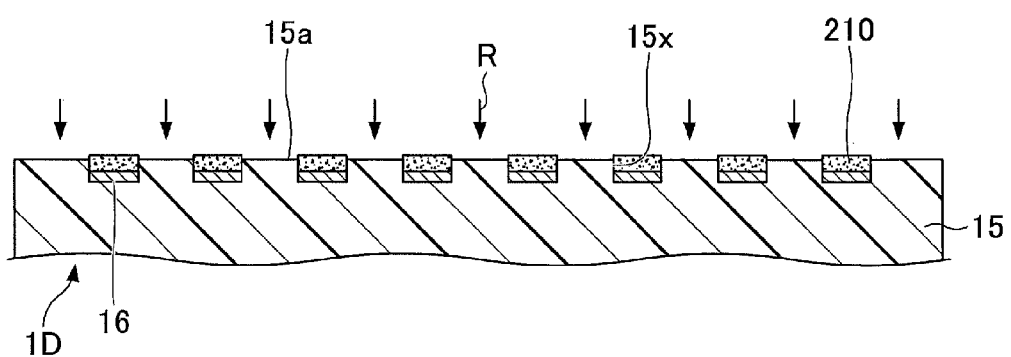

Then, as illustrated in FIG. 12C, the flux printing mask 200 of FIG. 12B is removed from the upper surface 15a of the insulating layer 15. Because the upper surface 15a of the insulating layer 15 is modified to have a hydrophobic property, the upper surface 15a of the insulating layer 15 is prevented from being wetted by the flux 210. Thus, the flux 210 does not spread on the upper surface 15a of the insulating layer 15 but gathers on the upper surface of the pad 16. That is, by modifying the upper surface 15a of the insulating layer 15 to have a hydrophobic property, the flux 210 is prevented from adhering to the upper surface 15a of the insulating layer 15. Thereby, only the upper surface of the pad 16 can be covered by the flux 210. It is to be noted that the flux 210 covering the upper surface of the pad 16 may be protruded, recessed, or flush with respect to the upper surface 15a of the insulating layer 15.

Figure 13A:
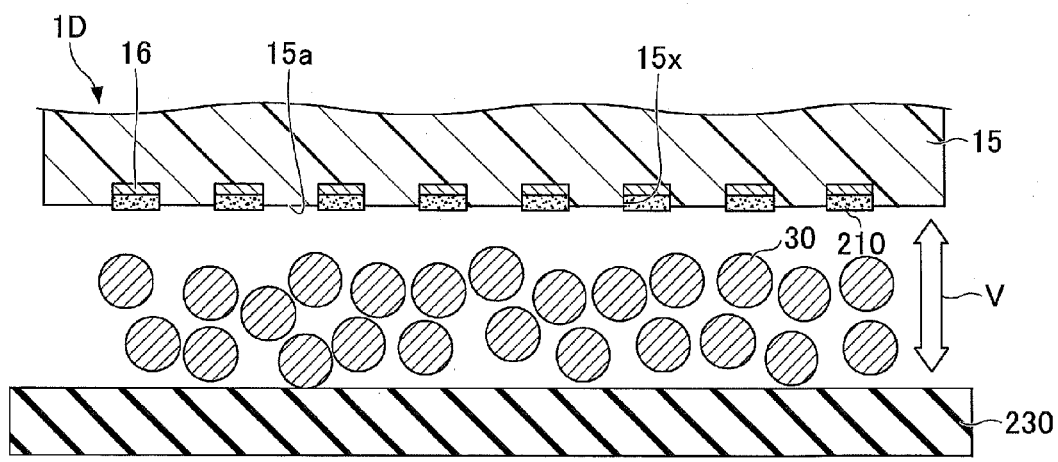
FIGS. 13A-13C are schematic diagrams illustrating processes for forming solder bumps on a wiring substrate according to the second embodiment of the present invention (part 2)

Then, as illustrated in FIG. 13A, the wiring substrate 1D is flipped upside-down and retained above a solder ball mounting jig 230, so that the upper surface 15a of the insulating layer faces the solder ball mounting jig 230. Many solder balls 30 are vertically moving in an arrow V direction above the solder ball mounting jig 230. Therefore, as illustrated in FIG. 13B, the solder balls 30 adhere to the flux 210 as the wiring substrate 1D is approached by the solder ball mounting jig 230.

Figure 13B:
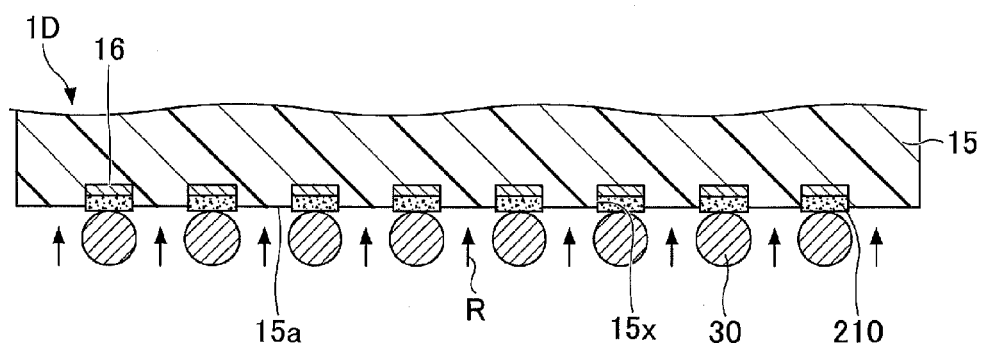

In the process illustrated in FIG. 13B, the solder balls 30 do not adhere to the upper surface 15a of the insulating layer but adhere only to the flux 210 covering the upper surface of the pad 16 because the flux 210 is hardly adhered to the upper surface 15a of the insulating layer 15. It is to be noted that, even if a portion of the flux 210 seeps from the upper surface 15a of the insulating layer 15 and have excess solder balls 30 adhered thereto, the excess solder balls 30 can be easily removed by a predetermined method. The predetermined method for removing the excess solder balls 30 may be, for example, blowing away the excess solder balls 30 with air, or removing the excess solder balls 30 with a brush.

Figure 13C:
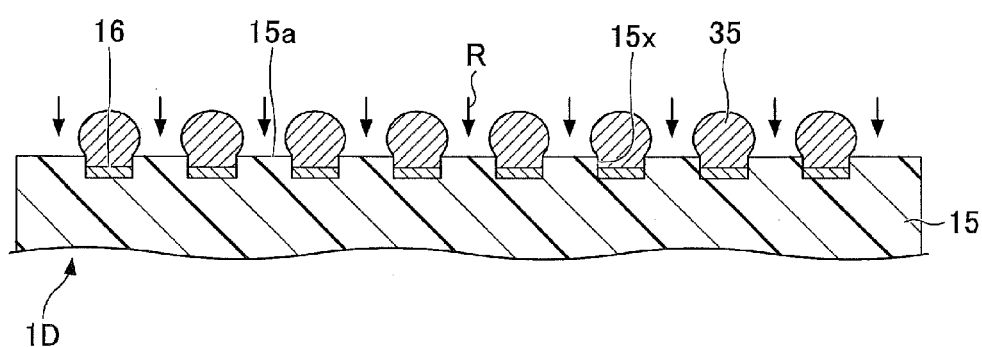

Then, the wiring substrate 1D that has the solder balls 30 adhered to the pads 16 interposed by the flux 210 is inserted in a reflow oven, so that the solder balls 30 are melted and then solidified. Thereby, as illustrated in FIG. 13C, the flux 210 evaporates, so that the solder bumps 35 are formed on corresponding pads 16.

According to a method of a related art, even in a case where the flux 210 having an appropriate viscosity is used, it is extremely difficult to prevent the flux 210 from seeping to the upper surface 15a of the insulating layer 15 if the upper surface 15a of the insulating layer 15 is not modified to have a hydrophobic property. Therefore, in a case where the upper surface 15a of the insulating layer 15 does not have a hydrophobic property, the flux 210 would spread and wet the upper surface 15a of the insulating layer 15 in the process illustrated in FIG. 12C. Thus, the method of the related art requires a solder ball mask to be placed on the upper surface 15a of the insulating layer 15 in the process illustrated in FIG. 13A, so that an area other than the pad 16 can be covered and many solder balls 30 can be prevented from adhering to the upper surface 15a of the insulating layer 15.

However, the method of the related art has a problem of requiring a solder ball mounting mask to be fabricated for each type of wiring substrate. Further, a solder ball mounting mask may be difficult to fabricate in a case where a wiring substrate has a complicated design. Further, because the location of an opening for a solder ball mounting mask is required to be designed with consideration of factors such as the flexibility of a wiring substrate, it is not easy to fabricate a solder ball mounting mask.

On the other hand, with the method of the second embodiment that modifies the upper surface 15a of the insulating layer 15 to have a hydrophobic property by using the silicone stamp 100, the flux 210 can be prevented from spreading and wetting the upper surface 15a of the insulating layer 15 and gather to the upper surface of the pad 16. Therefore, the use of a solder ball mounting mask is not required in the process illustrated in FIG. 13A for forming the solder ball 30 only to the upper surface of the pad 16 covered by the flux 210 and preventing the solder ball 30 from adhering to the upper surface 15a of the insulating layer 15 that is not covered by the flux 210. That is, the solder ball 30 can easily adhere only to the pad 16 without having to use the solder ball mounting mask.

Further, similar to the first embodiment, because the upper surface 15a of the insulating layer 15 is modified to have a hydrophobic property by using the silicone stamp 100, solidified solder 30 can be prevented from remaining on the upper surface 15a of the insulating layer 15. As a result, similar to the first embodiment, short-circuiting with another electronic device, between pins, or between wirings due to solidified solder 20 remaining on the upper surface 15a of the insulating layer 15 can be prevented.

<Third Working Example>

Two substrates that are the same as those of the first working example were prepared. Then, similar to the first working example, a pad formed of copper (Cu) and a solder resist layer A (thickness of approximately 20 μm) covering the pad were formed on each of the substrates. Then, an opening that exposes the pad was formed in the solder resist layer A. Each of the substrates corresponding to the wiring substrate illustrated in FIG. 1. It is to be noted that the diameter of the pad was approximately 70 μm and the pitch between the pads was approximately 130 μm.

Then, silicone stamping was performed on the upper surface of the solder resist layer of one of the two substrates. More specifically, similar to the process illustrated with FIG. 3A, the silicone stamp 100 was pressed to the upper surface of the insulating layer A with a force of 50 kg for 3 seconds. Then, the insulating layer A was heated at 150° C. for a predetermined time. As a comparative example, silicone stamping was not performed on the upper surface of the insulating layer B of the other one of the two substrates.

Then, with the method illustrated with FIGS. 12B and 12C, flux was applied to the pads of each of the two substrates. However, in this working example, the flux was applied to the entire upper surface of the solder resist layer A including the pad without using the flux printing mask 200 of FIG. 12B, so that the effect of silicone stamping can be confirmed more easily. Then, a microscope photograph of the upper surface of the solder resist layer A of each of the two substrates was taken by using a microscope (see FIGS. 14A and 14B). Then, with the method illustrated with FIGS. 13A and 13B, solder balls having substantially spherical shapes (approximately 75 μm in diameter) were adhered to the pads of each substrate by way of the adhesive force of the flux. Then, a microscope photograph of the upper surface of the solder resist layer A was taken by using a microscope (see FIGS. 15A and 15B).

Figure 14B:
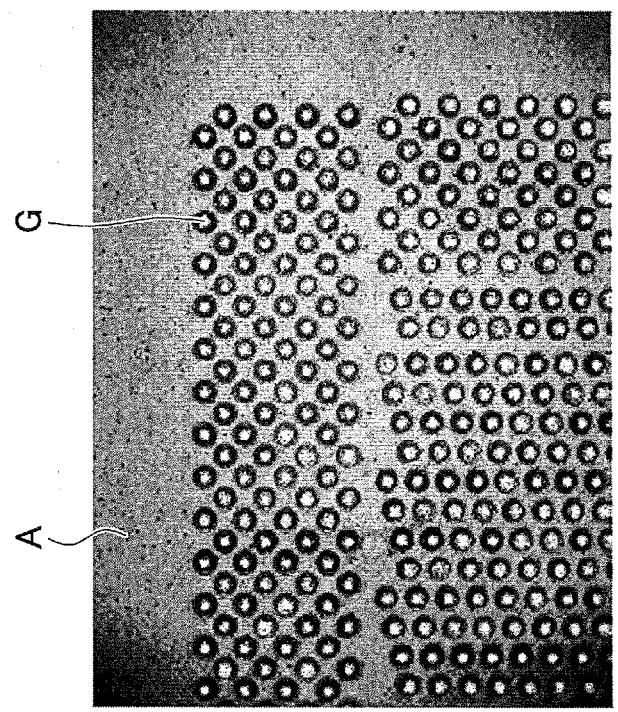
FIGS. 14A and 14B are microscope photographs obtained from a third practical example (part 1)
Figure 14A:
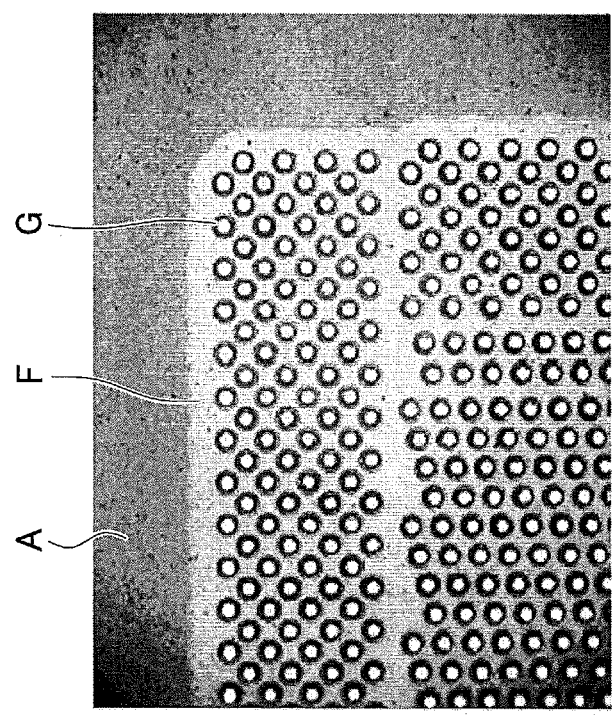
Figure 15B:
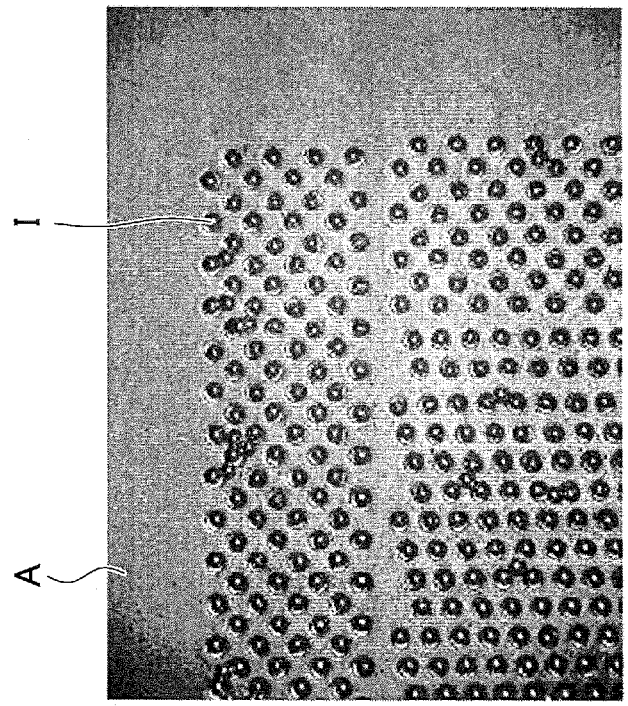
FIGS. 15A and 15B are microscope photographs obtained from the third practical example (part 2)
Figure 15A:
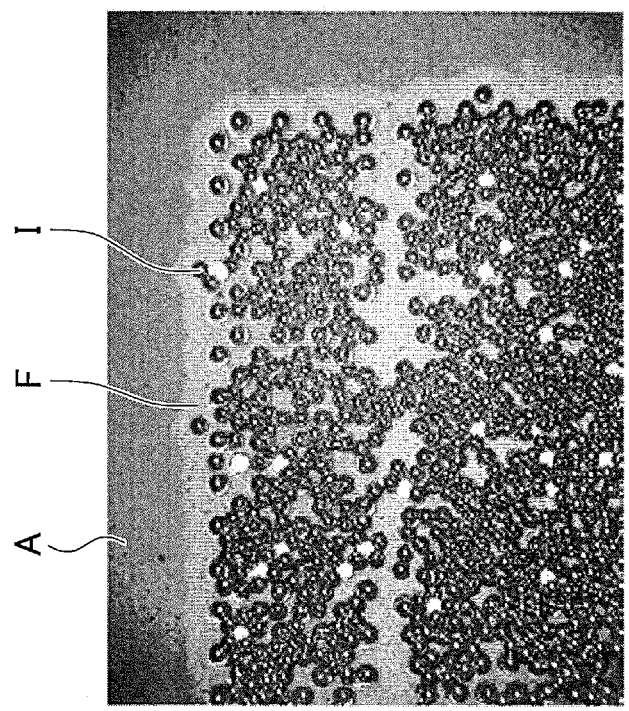

As illustrated in FIG. 14A, in a case where silicone stamping was not performed, flux F seeps to the upper surface of the solder resist layer A from the upper surface of a pad G. The flux F wets and spreads on the upper surface of the solder resist layer A to form ponds of flux F in-between adjacent pads G. Therefore, solder balls I not only adhered to the upper surface of the pads G but also irregularly adhered to areas where the flux F had wet and spread on the upper surface of the solder resist layer A as illustrated in FIG. 15A.

On the other hand, as illustrated in FIG. 14B, in a case where silicone stamping was performed, the flux F does not wet and spread on the upper surface of the solder resist layer A but gathers to the upper surface of the pad G because the upper surface of the insulating layer B is modified to have a hydrophobic property. That is, the flux F can be prevented from seeping to the upper surface of the solder resist layer A even where the flux printing mask 200 was not used. Therefore, as illustrated in FIG. 15B, the solder balls I adhered almost only on the upper surface of the pads G.

Although some of the solder balls I adhered to areas in-between the pads G, this result is considered to be due to the setting of the solder ball mounting jig. Even in a case where some of the flux F seeps to an area of the upper surface of the solder resist layer A and causes surplus solder balls I to adhere to such area to a degree as illustrated in FIG. 14B, the surplus solder balls I can be easily removed by the above-described methods.

As illustrated with FIGS. 14A and 14B, by performing silicone stamping, it was confirmed that a surface of a solder resist layer can be modified to have a hydrophobic property (wettability can be reduced) and flux can be prevented from seeping to the solder resist layer. Further, as illustrated with FIGS. 15A and 15B, it was confirmed that solder balls can be easily adhered only to the pads without having to use a solder ball mounting mask because flux can be prevented from seeping to the upper surface of the solder resist layer. Therefore, it was confirmed that flux may be applied without having to use the flux printing mask.

<Fourth Working Example>

Two substrates that are the same as those of the first working example were prepared. Then, a pad formed of copper (Cu) and an insulating layer B formed of epoxy type resin were formed (without forming a solder resist layer) on each of the substrates. Each of the substrates corresponds to the wiring substrate illustrated in FIG. 8. It is to be noted that the diameter of the pad was approximately 70 μm, the pitch between the pads was approximately 130 μm, and the depth from the upper surface of the insulating layer B to the upper surface of the pad (recessed amount) was approximately 20 μm.

Then, silicone stamping was performed on the upper surface of the insulating layer B of one of the two substrates. More specifically, similar to the process illustrated with FIG. 3A, the silicone stamp 100 was pressed to the upper surface of the insulating layer B with a force of 50 kg for 3 seconds. Then, the insulating layer B was heated at 150° C. for a predetermined time. As a comparative example, silicone stamping was not performed on the upper surface of the insulating layer B of the other one of the two substrates.

Figure 16B:
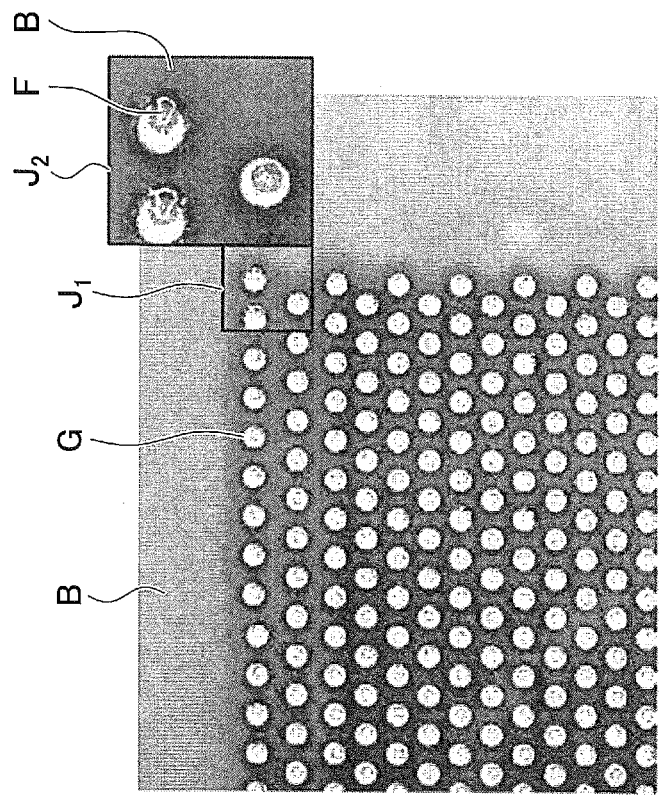
FIGS. 16A and 16B are microscope photographs obtained from a fourth practical example.
Figure 16A:
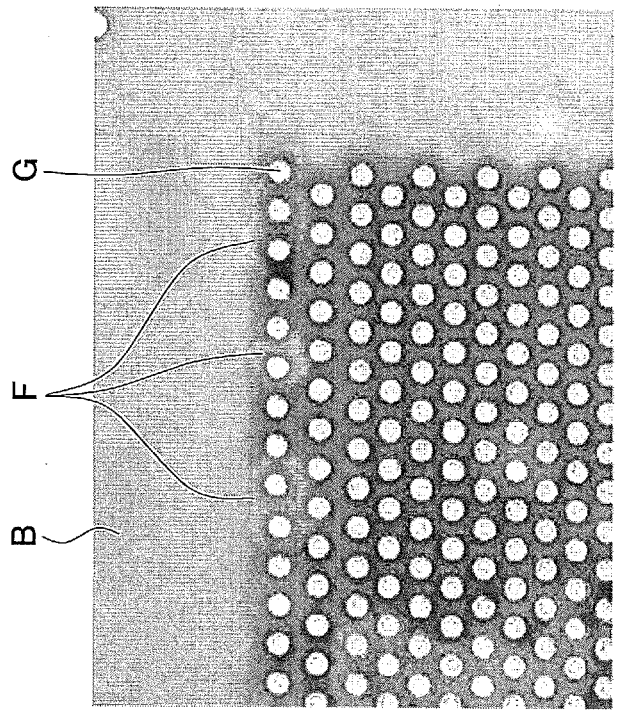

Then, with the method illustrated with FIGS. 12B and 12C (with use of the flux printing mask 200), flux was applied to the pads of each of the two substrates. Then, a microscope photograph of the upper surface of the solder resist layer A of each of the two substrates was taken by using a microscope. FIGS. 16A and 16B illustrate the results of the photographs.

As illustrated in FIG. 16A, in a case where silicone stamping was not performed, flux F seeps to the upper surface of the insulating layer B from the upper surface of the pad G and spreads quickly. On the other hand, as illustrated in FIG. 16B, in a case where silicone stamping was performed, the flux F does not wet and spread on the upper surface of the insulating layer B but gathers on the upper surface of the pad G because the upper surface of the insulating layer B is modified to have a hydrophobic property. Further, as illustrated in an enlargement $J_2$ of an area $J_1$ of the insulating layer B, the flux F does not seep to the upper surface of the insulating layer B and is retained as a dam on the upper surface of the pad G even in the areas in which the flux F contacts the upper surface of the insulating layer B.

As illustrated with FIGS. 16A and 16B, by performing silicone stamping, it was confirmed that a surface of an insulating layer can be modified to have a hydrophobic property (wettability can be reduced) and flux can be prevented from seeping to the insulating layer.

With the above-described embodiment and modified examples of the present invention, there can be provided a wiring substrate having an improved reliability that can prevent residue from remaining on its insulating layer.

Various aspects of the subject-matter described herein are set out non-exhaustively in the following numbered clauses:

1. A surface modification method comprising:
   modifying an outermost surface of an insulating layer to have a hydrophobic property by stamping silicone onto the outermost surface of the insulating layer.

2. The surface modification method of clause 1, wherein the insulating layer is heated after stamping the outermost surface of the insulating layer.

3. The surface modification method of clause 1,
   wherein the insulating layer includes a hydroxyl group or a carboxyl group, and
   wherein the modifying includes forming a covalent bond on the outermost surface of the insulating layer by a reaction between an oligomer contained in the silicone and the hydroxyl group or the carboxyl group.

4. A method for manufacturing a wiring substrate including an insulating layer and a pad exposed from the insulating layer, the method comprising:
performing the surface modification method of clause 1.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, the form of shipping the wiring substrate is not limited in particular. For example, the wiring substrate may be shipped in a state prior to having solder bumps or the like formed thereon (see, for example, FIG. 1) or a state subsequent to having solder bumps or the like formed thereon (see, for example, FIG. 4B). In a case where the wiring substrate is shipped in the latter state, the effect of the modification does not change even after the solder bumps or the like are formed. Therefore, in a case where the solder bumps or the like are re-melted during a process of mounting, for example, for a semiconductor chip on the wiring substrate by way of the solder bumps or the like, solder can be prevented from being adhered to an area other than the pad of the wiring substrate.

What is claimed is:

1. A wiring substrate comprising:
   an insulating layer; and
   a pad exposed from the insulating layer;
   wherein an outermost surface of the insulating layer is modified to have a hydrophobic property,
   wherein the insulating layer includes a hydroxyl group or a carboxyl group,
   wherein a covalent bond is formed on the outermost surface of the insulating layer by a reaction between a siloxane oligomer contained in silicone and the hydroxyl group or the carboxyl group to modify the outermost surface of the insulating layer to have the hydrophobic property, and
   wherein a solder bump is formed on the pad exposed from the insulating layer having the hydrophobic property.

2. The wiring substrate as claimed in claim 1, wherein the pad is formed on the outermost surface of the insulating layer.

3. The wiring substrate as claimed in claim 1, further comprising:
   another insulating layer is formed under the insulating layer;
   wherein the pad is formed on the another insulating layer, and
   wherein the insulating layer is a solder resist layer including an opening from which the pad is exposed.

4. The wiring substrate as claimed in claim 3,
   wherein the opening exposes an entire surface of the pad and a surface of the another insulating layer surrounding the pad, and
   wherein the surface of the another insulating layer exposed in the opening is modified to have the hydrophobic property.

* * * * *